United States Patent
Ishizuka et al.

(10) Patent No.: US 11,228,836 B2
(45) Date of Patent: Jan. 18, 2022

(54) SYSTEM FOR IMPLEMENTING FILTER CONTROL, FILTER CONTROLLING METHOD, AND FREQUENCY CHARACTERISTICS CONTROLLING METHOD

(71) Applicant: Yamaha Corporation, Hamamatsu (JP)

(72) Inventors: Kenji Ishizuka, Hamamatsu (JP); Kenichi Tamiya, Hamamatsu (JP); Takashi Mita, Saitama (JP); Shinichiro Kaneko, Tokyo (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 17/028,187

(22) Filed: Sep. 22, 2020

(65) Prior Publication Data

US 2021/0014609 A1    Jan. 14, 2021

Related U.S. Application Data

(63) Continuation of application No. PCT/JP2019/010577, filed on Mar. 14, 2019.

(30) Foreign Application Priority Data

Mar. 23, 2018 (JP) .............. JP2018-056232

(51) Int. Cl.
*H04R 3/04* (2006.01)
*H03H 17/02* (2006.01)

(52) U.S. Cl.
CPC .............. *H04R 3/04* (2013.01); *H03H 17/02* (2013.01)

(58) Field of Classification Search
CPC . H04R 3/04; H03G 5/00; H03G 5/005; H03G 5/025; H03G 5/165; H03H 17/02
(Continued)

(56) References Cited

U.S. PATENT DOCUMENTS 6,072,879 A    6/2000 Ouchi et al.
7,409,067 B2 *  8/2008 Yoshino ................. H03G 5/165
                                                    333/28 T (Continued)

FOREIGN PATENT DOCUMENTS

JP    47-000849 A    1/1972
JP    10-69280 A     3/1998
JP    2017-22537 A   1/2017

OTHER PUBLICATIONS

International Search Report (PCT/ISA/210) issued in PCT Application No. PCT/JP2019/010577 dated May 28, 2019 with English translation (four (4) pages).

(Continued)

*Primary Examiner* — Xu Mei
(74) *Attorney, Agent, or Firm* — Crowell & Moring LLP

(57) ABSTRACT

A system for implementing filter control includes an audio processing apparatus, an analog-to-digital converter, a digital-to-analog converter, a filter, and a processor. The processor is configured to receive parameters that define a frequency response in a given frequency bandwidth. The processor is also configured to generate, based on the parameters, a response curve representative of a frequency response of a filter. The processor is also configured to generate, based on the response curve, a filter coefficient of the filter. The lower inclined portion corresponds to, within the given frequency bandwidth, a frequency bandwidth that is lower than a frequency bandwidth corresponding to the upper inclined portion.

8 Claims, 8 Drawing Sheets

(58) Field of Classification Search
USPC .......................................................... 381/98
See application file for complete search history.

(56) References Cited

U.S. PATENT DOCUMENTS

| | | | |
|---|---|---|---|
| 10,728,663 B2* | 7/2020 | Ishizuka | H03G 5/025 |
| 2006/0159284 A1* | 7/2006 | Kobayashi | H04S 1/00 |
| | | | 381/98 |
| 2014/0177871 A1* | 6/2014 | Morton | H04R 3/04 |
| | | | 381/99 |
| 2017/0194941 A1* | 7/2017 | Barratt | H03H 17/0201 |

OTHER PUBLICATIONS

Japanese-language Written Opinion (PCT/ISA/237) issued in PCT Application No. PCT/JP2019/010577 dated May 28, 2019 (four (4) pages).

Japanese-language Office Action issued in Japanese Application No. 2018-056232 dated Sep. 28, 2021 with English translation (five (5) pages).

* cited by examiner

SYSTEM FOR IMPLEMENTING FILTER CONTROL, FILTER CONTROLLING METHOD, AND FREQUENCY CHARACTERISTICS CONTROLLING METHOD

CROSS REFERENCE TO RELATED APPLICATION

This Application is a Continuation Application of PCT Application No. PCT/JP2019/010577, filed Mar. 14, 2019, which is based on, and claims priority from Japanese Patent Application No. 2018-056232, filed Mar. 23, 2018, the entire contents of which are incorporated herein by reference.

BACKGROUND

Technical Field

The present disclosure relates to technology for controlling a filter that processes sound data.

Description of Related Art

To adjust sound emitted from a speaker to an acoustic space, such as a concert hall, an audio apparatus, such as an equalizer is used. The equalizer is a filter adjusting frequency characteristics. Examples of the equalizer include a parametric equalizer (PEQ). The PEQ includes filter elements controlling frequency characteristics of an input sound signal. An audio engineer (user) adjusts filter coefficients of the above-described equalizer through setting of parameters such as a center frequency of a band, a bandwidth, and a gain of each of the filter elements, thereby adjusting the frequency characteristics (frequency characteristics of playback system including an equalizer, amplifier, speaker, and acoustic space) of the sound emitted in the acoustic space to target characteristics.

In recent years, a flat type element has been proposed as a filter element of the PEQ in order to facilitate adjustment operation of the target characteristics. A frequency response of the flat type element includes a lower inclined portion, an upper inclined portion, and a center flat portion that is present between both and has a constant gain determined by the user. The lower inclined portion represents a frequency response in a section where the gain rises (or falls) from a reference gain (0 dB) to the designated gain as the frequency increases. The upper inclined portion represents a frequency response in a section in which the gain falls (or rises) from the designated value to the reference gain (0 dB) as the frequency increases. Each of the upper inclined portion and the lower inclined portion of the flat type element has a shape of a cosine curve.

Depending on the frequency characteristics of the playback system, however, adjustment cannot be easily performed by using the filter elements including the flat type element of the existing PEQ in some cases. For example, when the frequency characteristics of the playback system are inclined in a certain frequency band (e.g., volume level is higher as frequency is lower), the characteristics of the frequency band cannot be controlled to flat characteristics by one flat type element, and two or more filter elements are required. Furthermore, in acoustic adjustment in the acoustic space such as a concert hall, there is a case in which a gentle gradient (e.g., gradient corresponding to high frequency attenuation with distance) of the frequency characteristics over a wide frequency band from a low frequency to a high frequency is to be corrected; however, such a gradient cannot be corrected by the existing flat type element. With regard to the former relatively-narrow frequency band, the gradient of the frequency characteristics can be made flat by combination of two flat type elements; however, it is required to individually set parameters of each of the two flat type elements.

SUMMARY

The present disclosure was made in consideration of the above-described problem, and an object of the present disclosure is to provide techniques that enable the user to easily perform an input operation to adjust the frequency characteristics of the playback system to the target characteristics in PEQ.

To achieve the stated object, a system for implementing filter control according to one aspect of the present disclosure includes: an audio processing apparatus; an analog-to-digital converter; a digital-to-analog converter; a filter; and a processor, the processor being configured to: receive parameters that define a frequency response in a given frequency bandwidth, in which the given frequency bandwidth includes: a lower inclined portion in which a gain changes; an upper inclined portion in which the gain changes; and a center inclined portion in which the gain changes and that is present between the lower inclined portion and the upper inclined portion; generate, based on the parameters, a response curve representative of a frequency response of a filter; and generate, based on the response curve, a filter coefficient of the filter, in which the lower inclined portion corresponds to, within the given frequency bandwidth, a frequency bandwidth that is lower than a frequency bandwidth corresponding to the upper inclined portion.

A filter controlling method implemented by a processor according to another aspect of the present disclosure is a filter controlling method including: receiving parameters that define a frequency response in a given frequency bandwidth, in which the given frequency bandwidth includes: a lower inclined portion in which a gain changes; an upper inclined portion in which the gain changes; and a center inclined portion in which the gain changes and that is present between the lower inclined portion and the upper inclined portion; generating, based on the parameters, a response curve representative of a frequency response of a filter; and generating, based on the response curve, a filter coefficient of the filter, in which the lower inclined portion corresponds to, within the given frequency bandwidth, a frequency bandwidth that is lower than a frequency bandwidth corresponding to the upper inclined portion.

A frequency characteristics controlling method according to another aspect of the present disclosure is a method implemented by a processor, the method includes providing a filter element that controls frequency characteristics of a sound signal in a specific frequency bandwidth, the controlling of the frequency characteristics includes: controlling, based on a first parameter and a second parameter, a position and a width of the specific frequency bandwidth on a frequency axis; and controlling, based on a third parameter and a fourth parameter, a gradient of a frequency response in the specific frequency bandwidth, and a gain of the frequency response in the specific frequency bandwidth.

DETAILED DESCRIPTION

An embodiment of the present disclosure will be described below with reference to the drawings.

Figure 1:
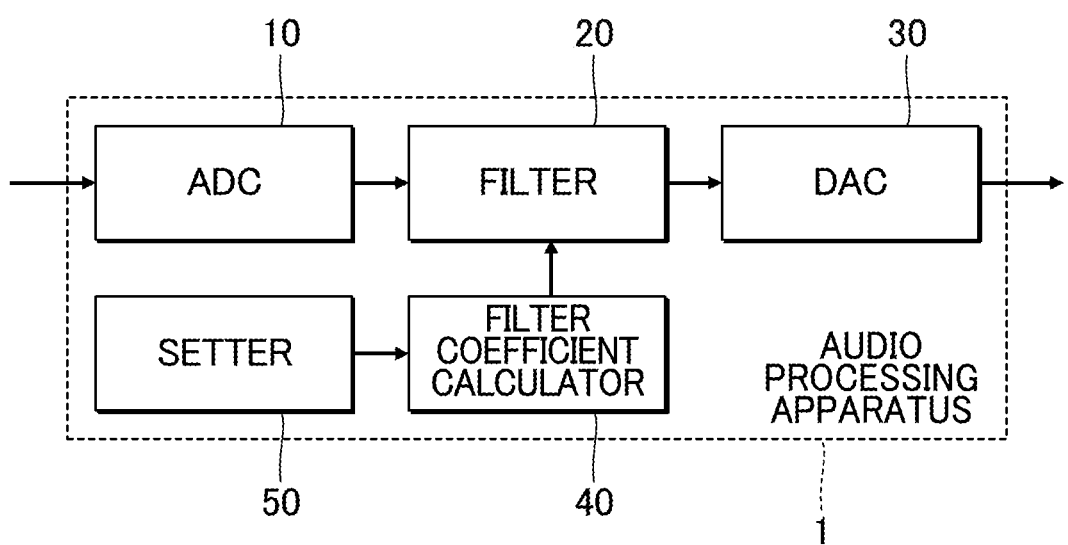
FIG. 1 is a functional block diagram of an audio processing apparatus 1 according to an embodiment of the present disclosure.

FIG. 1 is a functional block diagram of an audio processing apparatus 1 according to an embodiment of the present disclosure. The audio processing apparatus 1 is a PEQ to adjust sound output from a speaker to an acoustic space such as a concert hall. The PEQ includes filter elements controlling frequency characteristics of an input sound signal. As illustrated in FIG. 1, the audio processing apparatus 1 includes an analog-to-digital converter 10, a filter 20, a digital-to-analog converter 30, a filter coefficient calculator 40, and a setter 50. In the following description, the analog-to-digital converter 10 is referred to as "ADC 10", and the digital-to-analog converter 30 referred to as "DAC 30".

A sound source device (not illustrated in FIG. 1), such as an audio player, is connected to the ADC 10, and a speaker (not illustrated in FIG. 1) installed in the above-described acoustic space is connected to the DAC 30. An amplifier may be connected between the sound source device and the ADC 10, and an amplifier may be connected between the DAC 30 and the speaker. The ADC 10 performs analog-to-digital conversion on an analog input sound signal input from the sound source device (e.g., a microphone, a musical instrument, a recording device), and provides sound data as a conversion result to the filter 20. The filter 20 is a finite impulse response (FIR) filter. The filter 20 convolves the sound data provided from the ADC 10 with filter coefficients to control frequency characteristics of the sound data, and outputs the convolved sound data to the DAC 30. A frequency response of the filter 20 is defined by a plurality of kinds of parameters for determining filter coefficients of the filter 20. The DAC 30 converts the sound data from the filter 20 into an analog output sound signal, and outputs the analog output sound signal to the above-described speaker. The setter 50 provides a user interface that causes a user to set the parameters defining the frequency response of the filter 20. The setter 50 edits values of the parameters based on the parameters editing operation by the user, and provides the edited parameters to the filter coefficient calculator 40. The filter coefficient calculator 40 generates filter coefficients corresponding to the parameters provided from the setter 50, and provides the filter coefficients to the filter 20.

Figure 2:
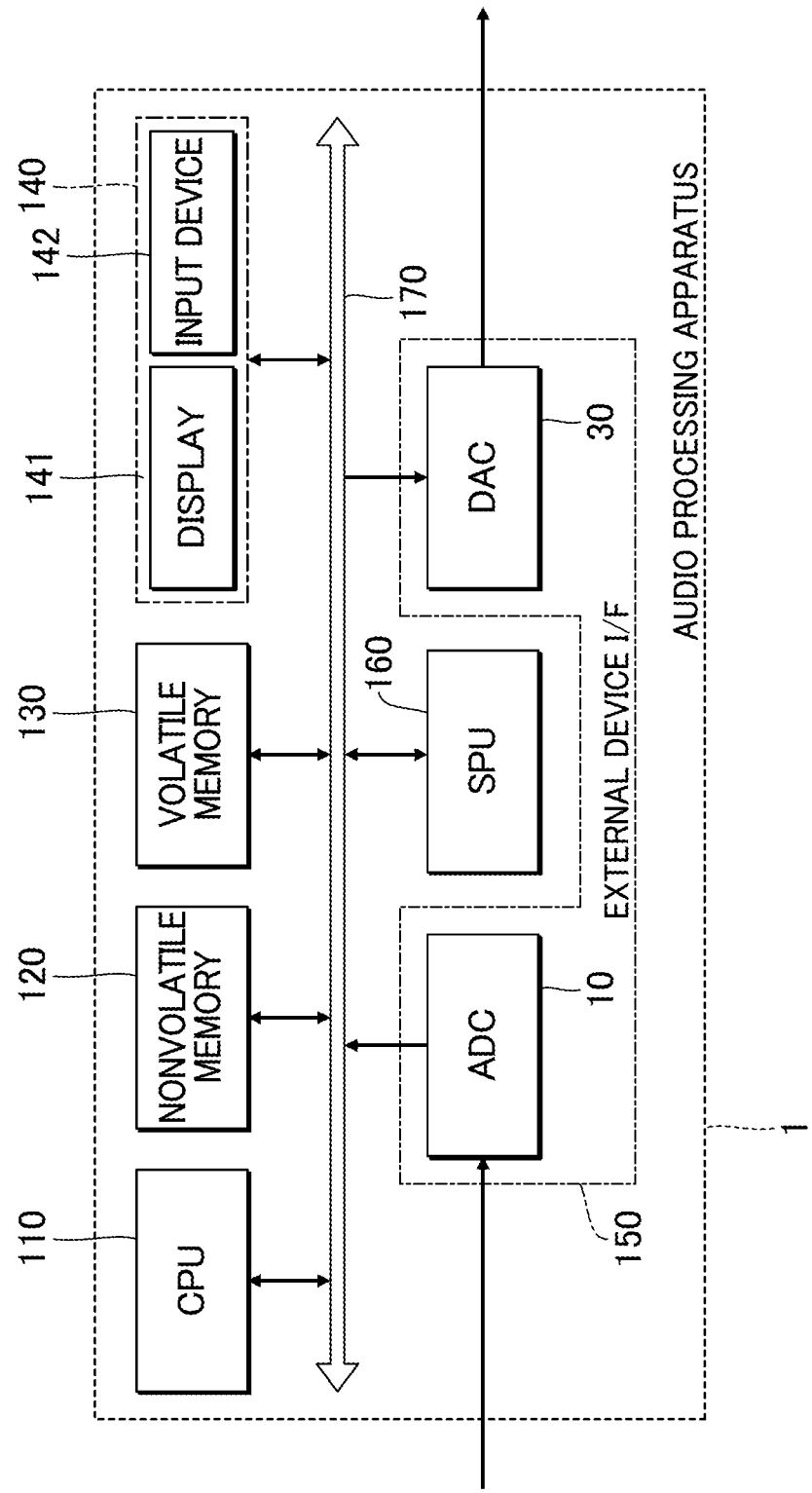
FIG. 2 illustrates an example diagram of a hardware configuration of the audio processing apparatus 1.

FIG. 2 illustrates an example block diagram of a hardware configuration of the audio processing apparatus 1. As illustrated in FIG. 2, the audio processing apparatus 1 includes a central processing unit (CPU) 110, a nonvolatile memory 120, a volatile memory 130, a user interface 140, an external device interface 150, a signal processing unit (SPU) 160 serving as the filter 20, and a bus 170 mediating data transfer between these components. In FIG. 2, the external device interface 150 is abbreviated as "external device I/F 150".

The nonvolatile memory 120 is, for example, a read only memory (ROM), and the volatile memory 130 is, for example, a random access memory (RAM). The nonvolatile memory 120 previously stores a filter control program that causes the CPU 110 to perform a filter control method providing features of the present embodiment. The volatile memory 130 is used as a work area for execution of the filter control program, by the CPU 110.

The CPU 110 includes one or more processors each executing programs. The CPU 110 serves as the filter coefficient calculator 40 (see FIG. 1) by executing the filter control program stored in the nonvolatile memory 120. The SPU 160 convolves the sound data that is obtained by performing the A/D conversion on the input sound signal, with the filter coefficients of the FIR filter in a time domain, thereby controlling the frequency characteristics of the sound data. In the alternative, the CPU 110 may perform convolution of the filter coefficients. In this case, the SPU 160 may be no longer required. The SPU 160 may perform the convolution of the filter coefficients in a frequency domain. In this case, the SPU 160 may convert the sound data in the time domain into sound data in the frequency domain by FFT, and may multiply the converted sound data by the filter coefficients. The SPU 160 obtains the sound data in the time domain by applying inverse FFT to the sound data as a multiplication result.

The external device I/F 150 is an aggregation of interfaces that connect the sound source device or the external device (e.g., the speaker) to the audio processing apparatus 1 through a signal line (e.g., an audio cable). As illustrated in FIG. 2, the external device I/F 150 includes the ADC 10 and the DAC 30. The external device I/F 150 provides the sound data subjected to the Analog/Digital conversion by the ADC 10, to the SPU 160 through the bus 170. The external device I/F 150 receives sound data output from the SPU 160 through the bus 170, and provides the sound data to the DAC 30.

The external device I/F 150 receives measurement data representative of frequency characteristics measured in a playback system before adjustment by the audio processing apparatus 1. For example, the measurement data, which represents the frequency characteristics previously measured by the other device, is recorded in a recording medium (e.g., a USB memory). The recording medium is connected to the external device I/F 150, and the audio processing apparatus 1 reads out the measurement data on the playback system from the recording medium. Alternatively, the microphone and the speaker that are installed in the above-described acoustic space may be connected to the external device I/F 150. The audio processing apparatus 1 itself may output test sound (e.g., white noise) from the speaker to the acoustic space, may pick up sound in the acoustic space by the microphone, and may generate the measurement data on the playback system from the picked-up sound.

The user I/F 140 includes a display 141 (e.g., a liquid crystal display), and an input device 142 (e.g., a mouse and a keyboard). The user I/F 140 serves as the setter 50 shown in FIG. 1 under the control of the CPU 110. The display 141 displays an image of a PEQ edit screen (see FIG. 3) that prompts the user to perform editing operation of the plurality of kinds of parameters under the control of the CPU 110. The frequency response of the filter 20 is defined by these parameters. The user operates the input device 142 to edit the plurality of kinds of parameters while viewing the PEQ edit screen. When the editing operation is performed by the user, the input device 142 provides operation data representing the editing operation to the CPU 110 through the bus 170. As a result, the above-described edit operation is transmitted to the CPU 110.

Next, operation of the audio processing apparatus 1 will be described. When a power supply (not illustrated in FIG. 2) of the audio processing apparatus 1 is turned on, the CPU 110 reads out the filter control program from the nonvolatile memory 120 to the volatile memory 130, and starts execution of the filter control program. The CPU 110 operating based on the filter control program receives the measurement data on the frequency characteristics of the playback system, and displays the PEQ edit screen (see FIG. 3) on the display 141 of the user I/F 140.

Figure 3:
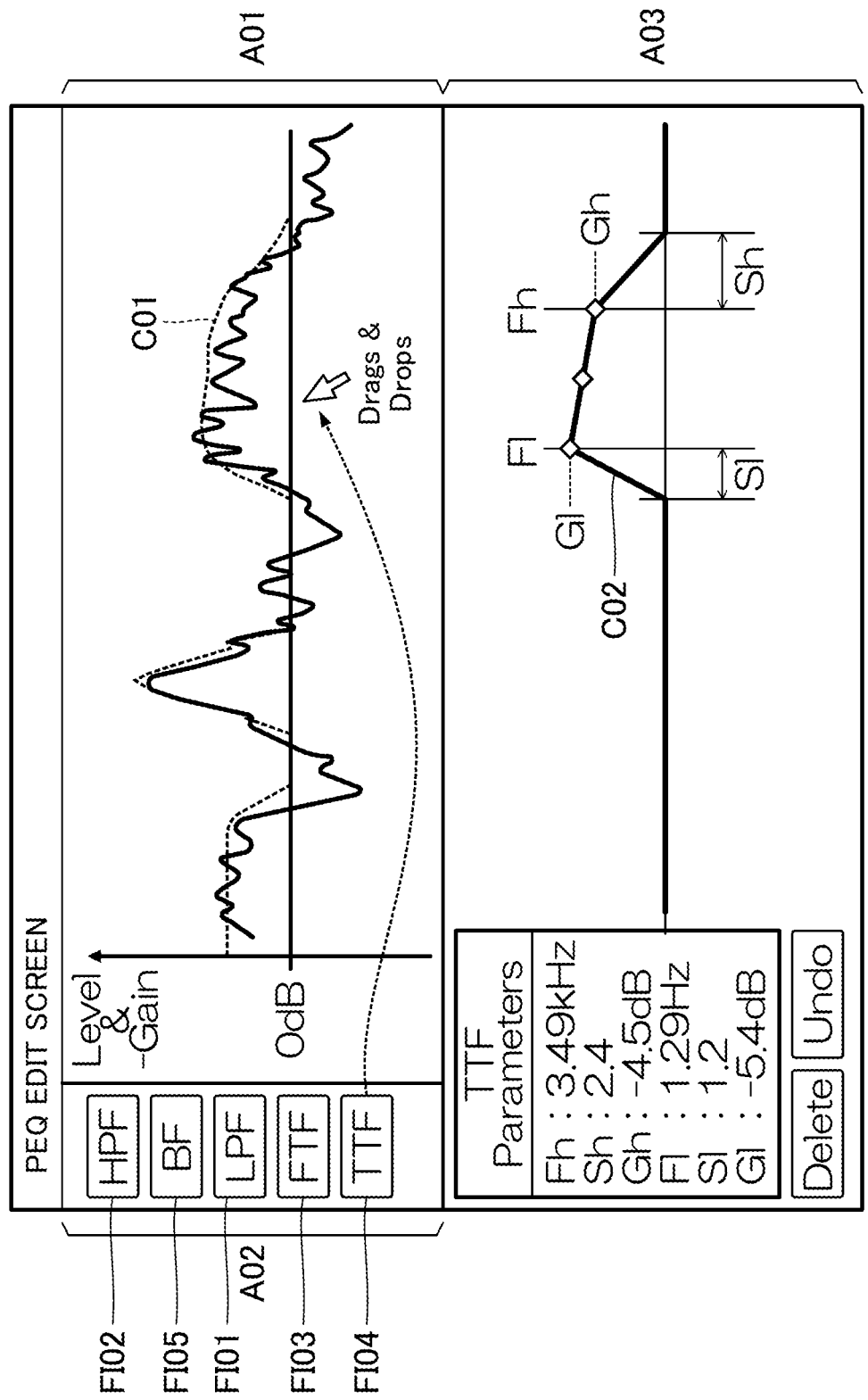
FIG. 3 is an example diagram illustrating a PEQ edit screen displayed on a display 141 of the audio processing apparatus 1.

FIG. 3 illustrates an example of a PEQ edit screen. As illustrated in FIG. 3, the PEQ edit screen includes the following three areas; an area A01; an area A03; and an icon area A02. In each of the areas A01 and A03, there are two coordinate axes, one of which represents a frequency, and the other of which represents a gain or amplitude level. A total curve CO is displayed in the area A01. The total curve C01 represents a frequency response obtained by combining frequency responses of the filter elements of the PEQ. Furthermore, a graph TR, which represents the frequency characteristics of the playback system represented by the measurement data, is drawn in the area A01 by being overlapped with the total curve C01. The user can acknowledge, from the graph TR drawn in the area A01, a frequency band to be subjected to adjustment (e.g., reduction of the gain by the PEQ), and an amount of the reduction. An individual curve C02, which represents a frequency response of one filter element selected by the user from the filter elements, is displayed in the area A03.

The following graphs may be applied instead of the graph TR: a graph in which the frequency characteristics of the playback system represented by the measurement data are not vertically inverted (level increases toward upper part of vertical axis) (see area A01 in FIG. 3); and a graph in which the frequency characteristics are vertically inverted (level decreases toward upper part of vertical axis). Furthermore, the graph to be drawn may be switched between the graph not vertically inverted and the graph vertically inverted, in response to user operation.

Icons are displayed in the icon area A02. These icons correspond to the respective filter elements to adjust the frequency characteristics of the playback system. In FIG. 3, five kinds of icons FI01 to FI05 are illustrated. The icons FI01 to FI05 are previously associated with classes of the respective filter elements indicated by the icons. Each of the classes of the filter elements includes parameters defining the frequency response of the corresponding filter element.

For example, the icon FI01 represents a low-pass filter (LPF) element. The class corresponding to the icon FI01 includes three kinds of parameters: (i) a cutoff frequency Fh, (ii) a gain Gh, and (iii) a gradient Sh of the LPF. The gradient Sh represents a gradient level of a gain of the LPF element in a frequency section (upper inclined portion) where the gain of the LPF element falls from the gain Gh to 0 dB. The gradient level refers to a parameter representing a gradient by a width of the frequency section. In place of the cutoff frequency Fh, the gain Gh, and the gradient Sh, the following may be used as the parameters of the LPF element: the cutoff frequency Fh; an order Nh; and a quality factor Qh. The quality factor Qh refers to a parameter representing the gradient in the frequency response by a half width.

The icon FI02 represents a high-pass filter (HPF) element. The class corresponding to the icon FI02 includes three kinds of parameters: (i) a cutoff frequency F1, (ii) a gain G1, and (iii) a gradient S1 of the HPF. The gradient S1 represents a gradient level of a gain of the HPF element in a frequency section (lower inclined portion) where the gain of the HPF element rises from 0 dB to the gain G1. In place of the cutoff frequency F1, the gain G1, and the gradient S1, the following may be used as the parameters of the HPF element: the cutoff frequency F1; an order N1; and a quality factor Q1. The quality factor Q1 refers to a parameter representing the gradient in the frequency response by a half-width.

The icon FI03 represents a flat type filter (FTF) element. The frequency response of the FTF element is divided into a lower inclined portion, a center flat portion, and an upper inclined portion on the frequency axis. The lower inclined portion corresponds to a frequency bandwidth that is lower than a frequency bandwidth corresponding to the upper inclined portion. In the center flat portion, the gain is maintained constant. The class corresponding to the icon FI03 includes five kinds of parameters: (i) a gain G, (ii) a lower frequency F1, (iii) a lower gradient S1, (iv) an upper frequency Fh, and (v) an upper gradient Sh. The gain G refers to a gain in the center flat portion of the FTF element. The lower frequency F1 corresponds to a boundary between the center flat portion and the lower inclined portion. The lower gradient S1 refers to a parameter representing a gradient level of the lower inclined portion. The upper frequency Fh corresponds to a boundary between the center flat portion and the upper inclined portion. The upper gradient Sh refers to a parameter representing a gradient level of the upper inclined portion.

The icon FI04 represents a tilt type filter (TTF) element. The frequency response of the TTF element is divided into a lower inclined portion, a center inclined portion, and an upper inclined portion on the frequency axis. The lower inclined portion corresponds, within a given bandwidth, to a frequency bandwidth that is lower than a frequency bandwidth corresponding to the upper inclined portion, on the frequency axis. In the center inclined portion, the gain linearly increases or decreases as the frequency increases. In other words, the TTF element includes the center inclined portion in place of the center flat portion of the FTF element. The center inclined portion has a substantially constant gradient. The TTF element provides one of the features of the present embodiment. The class corresponding to the icon FI04 includes six kinds of parameters: (i) a lower frequency F1, (ii) a gain G1; (iii) a lower gradient S1; (iv) an upper frequency Fh; (v) a gain Gh; and (vi) an upper gradient Sh. The lower frequency F1 corresponds to a boundary between the center inclined portion and the lower inclined portion. The gain G1 refers to a gain at the lower frequency F1. The lower gradient S1 refers to a parameter representing a gradient level of the lower inclined portion. The upper frequency Fh corresponds to a boundary between the center inclined portion and the upper inclined portion. The gain Gh refers to a gain at the upper frequency Fh. The gain G1 and the gain Gh may be different from each other. The upper gradient Sh refers to a parameter representing a gradient level of the upper inclined portion. In place of the gradient Sh or Sl represented by the frequency width, a quality factor Qh or Ql representing a gradient by a half width may be used.

The icon FI05 represents a bell filter (BF) element. The bell filter has a bell-shaped frequency response. The class corresponding to the icon FI05 includes three parameters: (i) a center frequency Fc; (ii) a center gain Gc; and (iii) a quality factor Q, in a band of the BF element.

Figure 4:
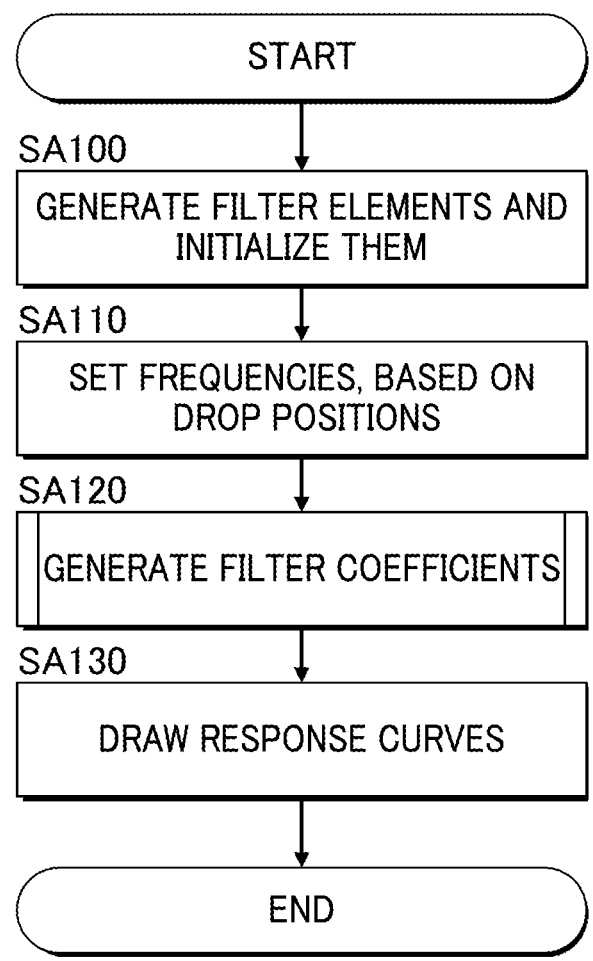
FIG. 4 illustrates a flow of filter control processing performed by a CPU 110 of the audio processing apparatus 1, based on a filter control program.

The user selects an icon corresponding to a desired filter element used for adjustment of the frequency characteristics of the playback system among the icons displayed in the icon area A02 by using the input device 142. The user drags and drops the selected icon to a position corresponding to a desired frequency band processed by the filter element on the frequency axis of the area A01. FIG. 4 illustrates a flow of filter control processing performed by the CPU 110. When the CPU 110 receives operation data representing the drag-and drop-operation of the icon by the user, the CPU 110 performs the filter control processing on the bases of the filter control program, as follows. The operation data includes information on a start position and an end position of the drag-and-drop operation.

When having received the operation data, the CPU 110 generates an instance of the filter element corresponding to the dragged and dropped icon based on the class of the filter element, and initializes the parameters defining the frequency response of the filter element (step SA100). More specifically, the CPU 110 specifies the icon located at the start position represented by the operation data, and generates a new filter element from the class corresponding to the icon. For example, in a case in which the icon FI04 is dragged and dropped, the CPU 110 generates an instance of the TTF element (TTF element), and sets the six kinds of parameters defining the frequency response of the TTF element to initial values. In the following, operation of the CPU 110 will be described in the case in which the icon F104 is dragged and dropped.

In step SA110, the CPU 110 sets the upper frequency Fh and the lower frequency Fl corresponding to the end position (i.e., drop position of icon) represented by the operation data. For example, the CPU 110 sets a frequency higher by a given frequency than the frequency corresponding to the above-described drop position as the upper frequency Fh. In addition, the CPU 110 sets a frequency lower by a given frequency than the frequency corresponding to the above-described drop position as the lower frequency Fl. Next, the CPU 110 generates the filter coefficients of the FIR filter from all of the parameters included in all kinds of set filter elements (including the TTF element) (step SA120). Thereafter, the display 141 draws the total curve C01 representing the frequency response of the FIR filter (PEQ) in the area A01 of the PEQ edit screen, under control of the CPU 110. In addition, the display 141 draws the individual curve C02 representing the frequency response of the single TTF element in the area A03 (step SA130). The contents of filter coefficient generation processing in step SA120 will be described in detail below.

Figure 5:
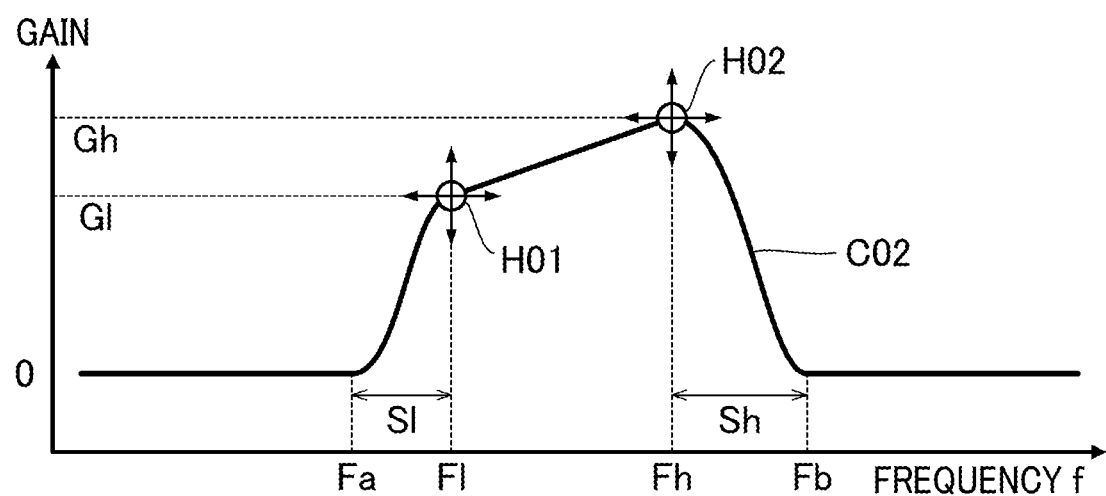
FIG. 5 illustrates six kinds of parameters defining a frequency response of a TTF element and an example update mode of the parameters.

In step SA130, the display 141 displays handle icons in the icon area A03 together with the individual curve C02 of the frequency response of the filter element, under control of the CPU 110. The handle icons allow the user to change the values of the parameters defining the frequency response. For example, in the case in which the user drags and drops the icon FI04 corresponding to the TTF element to the area A01, or in a case in which a part of the TTF element in the total curve CO displayed in the area A01 is selected by mouse click, the display 141 displays the individual curve C02 of the TTF element to which handle icons H01 and H02 are added in the area A03, under control of the CPU 110, as illustrated in FIG. 5. The handle icon H01 is disposed at a position corresponding to a boundary between the lower inclined portion and the center inclined portion. The handle icon H02 is disposed at a position corresponding to a boundary between the upper inclined portion and the center inclined portion. As illustrated in FIG. 5, the frequency response in a frequency bandwidth (f<Fa, f>Fb) outside of the given frequency bandwidth (Fa<f<Fb) is set to the reference level (e.g., 0 dB), irrespective of values of the parameters.

When the user moves (drags) the handle icon H01 or H02 in vertical and horizontal directions by using the input device 142, the CPU 110 changes a parameter corresponding to the input operation among the parameters defining the frequency response of the TTF element. For example, when the user moves the handle icon H01 in the horizontal direction (in a frequency axis direction), the CPU 110 changes the lower frequency F1. When the user moves the handle icon H02 in the horizontal direction, the CPU 110 changes the upper frequency Fh. Furthermore, when the user moves the handle icon H01 in the vertical direction (in gain axis direction), the CPU 110 changes the lower gain Gl. When the user moves the handle icon H02 in the vertical direction, the CPU 110 changes the upper gain Gh. The moving operation in the horizontal direction and the moving operation in the vertical direction of the handle icon H01 or H02 may be performed by a handler such as a rotary knob or a slider.

Figure 6:
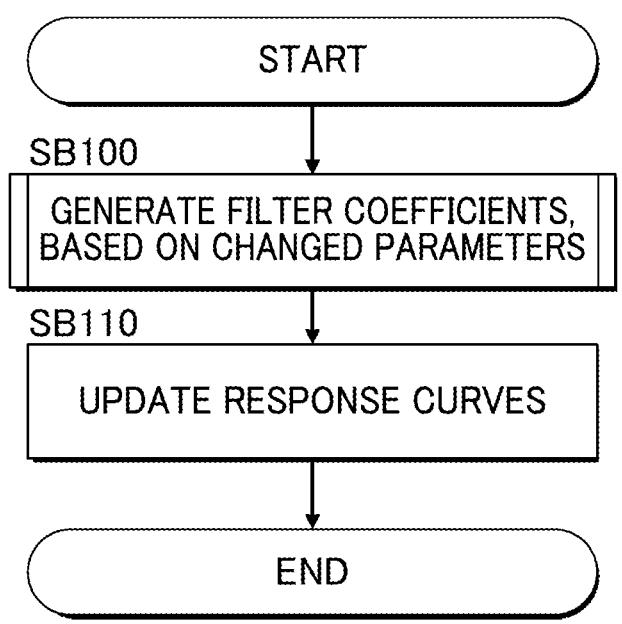
FIG. 6 illustrates a flow of filter coefficient change processing performed by the CPU 110 in response to change of parameter values.

When the user performs an input operation to move a handle icon of a filter element by using the input device 142, operation data representing the user operation is transmitted to the CPU 110. The CPU 110 changes values of parameters corresponding to the handle icon of the filter element based on the operation data. Furthermore, the CPU 110 performs filter coefficient change processing in response to change of a value of any of the parameters. FIG. 6 illustrates a flow of the filter coefficient change processing. As illustrated in FIG. 6, the CPU 110 generates filter coefficients, based on the changed parameters (step SB100). Thereafter, the CPU 110 updates the response curves (total curve C01 and individual curve C02) drawn in the PEQ edit screen (step SB110). The generation processing performed by the CPU 110 in step SB100 is basically identical to the above-described generation processing in step SA120, and the detail of the generation processing is described below.

Figure 7:
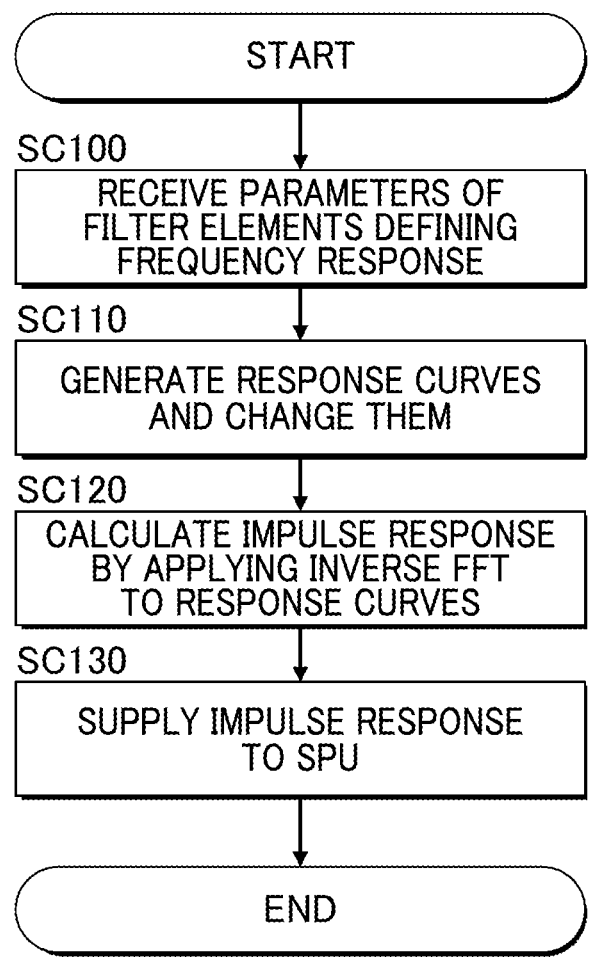
FIG. 7 illustrates a flow of filter coefficient generation processing performed by the CPU 110 based on the filter control program.

FIG. 7 illustrates a flow of the filter coefficient generation processing performed in step SA120 of the filter control processing. A flow of the filter coefficient change processing in step SB100 is also the same.

In the filter coefficient generation processing, the CPU 110 receives parameters of one or a plurality of filter elements defining the frequency response of the PEQ (step SC100). These filter elements correspond to one or a plurality of filter elements configuring the PEQ, namely, correspond to one or a plurality of filter elements sequentially disposed in the area A01 by the drag-and-drop operation by the user.

In next step SC110, the CPU 110 generates response curves (total curve CO and individual curve C02) representing a frequency response defined by the parameters received in step SC100. Each of the response curves is represented by a straight line or a curved line in a two-dimensional plane in which one of coordinate axes represents a frequency and the other coordinate axis represents a gain.

In step SC110, the CPU 110 first generates curves of frequency responses of the respective filter elements defined by the parameters of the filter elements among the parameters received in step SC100. Furthermore, the CPU 110 combines the generated curves to generate a curve of the frequency response of the filter (PEQ). The method of generating the curve for each of the filter elements other than the TTF element is well-known and description thereof is omitted. The curve of the TTF element is generated while being divided into three portions in the following manner 1 to 3.

Generation Process 1

A lower curve that changes from the gain G1 to the reference level (0 dB) in a direction in which the frequency is reduced from the lower frequency F1 is generated in a frequency range (first range) of a width represented by the lower gradient S1.

Generation Process 2

A center curve that linearly changes from the gain G1 to the gain Gh is generated in a frequency range (second range) from the lower frequency F1 to the upper frequency F1. Although the gain is linearly changed from the gain G1 to the gain Gh, the line is called a "curve" because the line is curved by adjustment in the adjustment step in some cases.

Generation Process 3

An upper curve that changes from the gain Gh to the reference level (0 dB) in a direction in which the frequency rises from the upper frequency Fh is generated in a frequency range (third range) of a width represented by the upper gradient Sh. These generation processes 1 to 3 may be performed in any order.

The processing in the generation processes 1 to 3 includes an adjustment step to adjust a curve shape such that the curve continues (i.e., is smoothly connected) at a boundary between the lower inclined portion and the center inclined portion or a boundary between the upper inclined portion and the center inclined portion. The curve continuing at the boundary represents that the value of the curve and a differential value thereof are both continuously changed through the boundary. The reason the adjustment step is required is because the response curve of the filter element at any frequency is not smooth, undesirable sharp phase change occurs in the frequency, and adverse effects of the phase change may be perceived by a listener of the sound when played.

In a case of an existing FTF element, it is not very difficult to make both of the value of the curve and the differential value thereof continuous at the boundary between the lower inclined portion and the center inclined portion or the boundary between the upper inclined portion and the center inclined portion. For example, a cosine curve of a half wavelength changed from "−1" to "1" is prepared, a numerical value "−1" of a lower end of the cosine curve is adjusted to the reference gain at one end of the first range, and a numerical value "1" of an upper end of the cosine curve is adjusted to the gain G1 at the other end (boundary) of the first range. This makes the lower curve and the curve of the center flat portion continuous. Likewise, with regard to the upper inclined portion, a numerical value "−1" of a lower end of a cosine curve is adjusted to the reference gain at one end of the third range, and a numerical value "1" of an upper end of the cosine curve is adjusted to the gain Gh at the other end of the third range. This makes the upper curve and the curve of the center flat portion continuous.

In contrast, in the case of the TTF element, there is no simple method to smoothly connect the lower curve or the upper curve with the center curve at the boundary. For example, in a case in which a cosine curve of a half wavelength is used as the lower curve or the upper curve, and the gain at the boundary is adjusted to the gain at the boundary with the center inclined portion (simple connection) in a manner similar to the FTF element, the gradient (differential value) of the cosine curve at the boundary is not equal to the gradient of the center inclined portion. On the other hand, at a part in which the gradient of the cosine curve is equal to the gradient of the center inclined portion, the gain of the cosine curve is not equal to the gain G1 or Gh of the center inclined portion.

Therefore, in the present embodiment, to make the lower inclined portion or the upper inclined portion continuous with the center inclined portion near the boundary, the CPU 110 performs slightly complicated adjustment of the curve in the adjustment step. For example, subsequent to the above-described simple connection, the CPU 110 further deletes a given range including the boundary of the connected curve, and generates a curve in the deleted range by interpolation calculation such as fourth-order or higher-order Lagrange interpolation.

Figure 8:
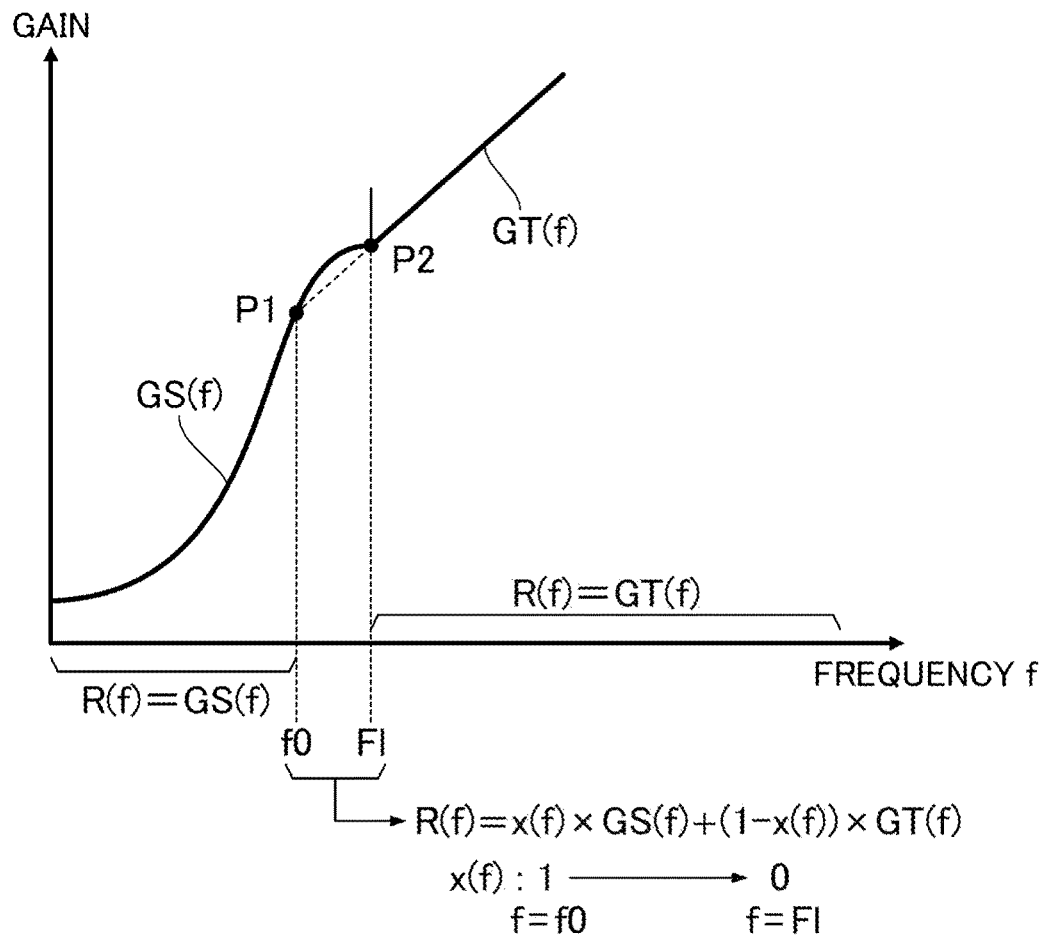
FIG. 8 illustrates an example of a response curve adjustment processing performed by the CPU 110 based on the filter control program.

Furthermore, the CPU 110 may perform processing illustrated in FIG. 8 subsequent to the above-described simple connection. More specifically, the CPU 110 first causes a tentative lower curve GS(f) and an extended straight line GT(f) to intersect each other at an intersection P1 and an intersection P2. The tentative lower curve GS(f) refers to a cosine curve of a half wavelength having an upper end located at the frequency F1. The extended straight line GT(f) refers to a tangential line of the upper curve or the center curve (i.e., extended line of upper curve or center curve) at the frequency Fh. As illustrated in FIG. 8, the lower curve GS(f) and the extended straight line GT(f) intersect each other at two intersections, one of which is the intersection P2 at the frequency F1, and the other one of which is the intersection P1 at a frequency f0 that is lower than the frequency F1.

The CPU 110 calculates a curve R(f) from the frequency f0 (f0<F1) of the intersection P1 to the frequency F1 of the intersection P2 by the following expression (1). As is clear from the equation (1), the curve R(f) corresponds to a weighted sum of the lower curve GS(F) and the extended straight line GT(f) with a variable x(f) as a weight. The variable x(f) continuously decreases from 1 to 0 as the frequency increases from the frequency f0 to the frequency F1. When the curve R(f) is used in a range from the frequency f0 to the frequency F1, the lower curve and the center curve continue. A similar method is applicable to the upper curve.

$$R(f)=x(f)\times GS(f)+(1-x(f))\times GT(f) \qquad (1)$$

The two examples are described in the present embodiment; however, the method is not limited thereto, and another method may be used. Use of the cosine curve for the lower curve or the upper curve is not essential, and other curves may be used.

In step SC110, the CPU 110 estimates (generates) the filter coefficients that make the frequency response of the filter 20 approximate to the response curve created in step SC110. More specifically, the CPU 110 applies inverse FFT to the response curve generated in step SC110, thereby calculating an impulse response. Thereafter, the CPU 110 provides the impulse response calculated in step SC120 as the filter coefficients to the SPU 160 (step SC130). In a case in which the SPU 160 performs convolution in the frequency domain, the CPU 110 supplies the response curve generated in step SC110 as the filter coefficients to the SPU 160. The SPU 160 (filter 20) convolves the sound data with the filter coefficients supplied from the CPU 110, to control the frequency characteristics of the sound data. In other words, the SPU 160 processes the sound data based on the response curve generated by the CPU 110.

According to the audio processing apparatus 1 of the present embodiment, it is possible to easily adjust the gradient of the frequency characteristics of the playback system to the target characteristics in a specific frequency band. In the TTF element of the present embodiment, the number of parameters to be set is large as compared with the FTF element by one kind of parameter defining the gradient of the inclined portion. However, according to the audio processing apparatus 1 of the present embodiment, a single TTF element can effectively correct the gradient of the frequency characteristics of the playback system. As compared with a mode in which correction is performed using an existing FTF element, the number of filter elements used can be reduced, which makes it possible to reduce the number of parameters to be set as a whole. In addition, the user can easily perform adjustment operation of the target characteristics in the PEQ as compared with the existing apparatus.

B: Modifications

The following modifications may be added to the above embodiment.

Figure 9:
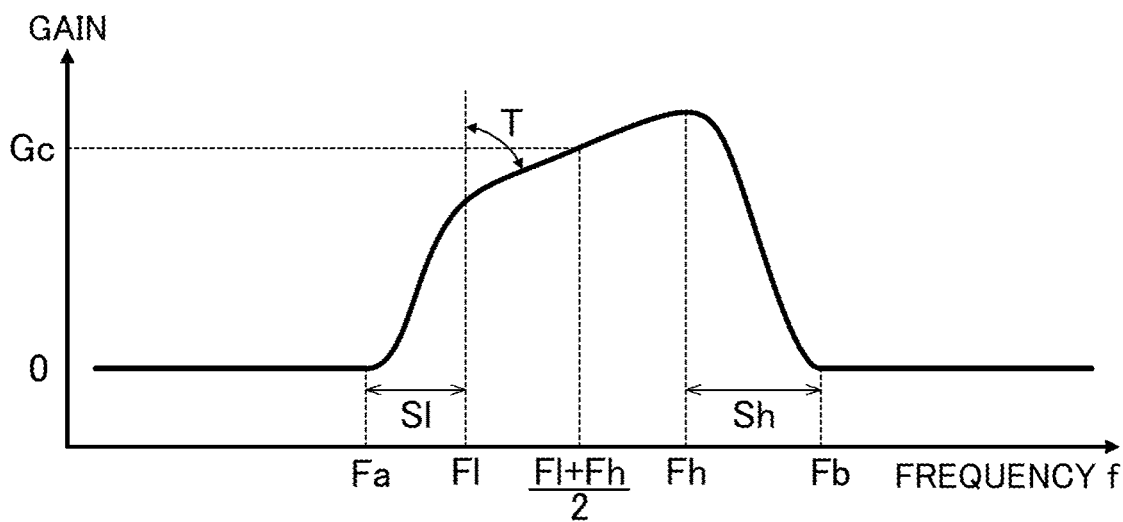
FIG. 9 is a diagram illustrating six kinds of parameters defining the frequency response of the TTF element and an example update mode of the parameters.

(1) The six kinds of parameters defining the frequency response of the TTF element (specifically, the upper frequency Fh, the upper gradient Sh, the upper gain Gh, the lower frequency Fl, the lower gradient Sl, and the lower gain Gl) are not limited thereto. For example, as illustrated in FIG. 9, the frequency response of the TTF element may be defined using the following: the upper frequency Fh; the upper gradient Sh; the lower frequency Fl; the lower gradient Sl; a center gain Gc; and a gradient T. The center gain Sc refers to a gain at a frequency intermediate between the upper frequency Fh and the lower frequency Fl. The gradient T refers to an angle formed by a center curve in the center inclined portion to a coordinate axis (e.g., gain axis).

In addition, in place of the upper frequency Fh and the lower frequency Fl, a first parameter (e.g., center frequency of specific band) designating a position of a specific band and a second parameter representing a width of the specific band may be used. The upper frequency Fh can be calculated by adding a half-value of the second parameter to the first parameter, and the lower frequency Fl can be calculated by subtracting the half-value of the second parameter from the first parameter. Furthermore, the upper gradient Sh and the lower gradient Sl may not be variables, and may be given fixed values. The TTF element in the present disclosure is a filter in which the position and the width of the specific band and the gradient and the gain of the center inclined portion of the frequency response are controlled on the bases of the four parameters. The configuration of the four kinds of parameters is freely selected within that range.

(2) In the above-described embodiment, the single audio processing apparatus 1 is described in which it includes the FIR filter to process the sound signal based on the filter coefficients and the filter controlling to supply the filter coefficients to the filter based on the parameters set by input operation from the user. Alternatively, the audio processing apparatus may include two devices as follows: (i) a filter control device; and (ii) a filter processing device including the filter, and they may be independent of each other.

As for the filter controlling, the audio processing apparatus 1 (CPU 110) according to the embodiment receives the parameters that define the frequency response and includes the specific parameters defining the center inclined portion between the lower inclined portion and the upper inclined portion in a given bandwidth, and generates the response curve representing the frequency response of the filter in a frequency-gain plane based on the parameters.

The filter element refers to a filter element controlling the frequency characteristics of the specific band of the sound signal. To control the frequency characteristics, based on a first parameter and a second parameter, a position and a width of the specific frequency bandwidth on a frequency axis are controlled. Then, based on a third parameter and a fourth parameter, a gradient of a frequency response in the specific frequency bandwidth, and a gain of the frequency response in the specific frequency bandwidth are controlled.

(3) In the embodiment, a case in which the gain is changed in opposite directions between the lower inclined portion and the upper inclined portion is illustrated. However, the change mode of the gain in the lower inclined portion and the upper inclined portion is not limited thereto. In an example, a case is assumed in which the gain rises to the designated value Gl in the lower inclined portion, the gain decreases from the designated value Gl to the designated value Gh lower than the reference gain (0 dB) in the center inclined portion. In this case, the gain in the upper inclined portion rises from the designated value Gh to the reference gain. Likewise, a case is assumed in which the gain decreases to the designated value Gl in the lower inclined portion and the gain rises from the designated value Gl to the designated value Gh higher than the reference gain (0 dB) in the center inclined portion. In this case, the gain in the upper inclined portion decreases from the designated value Gh to the reference gain. In other words, the gain may rise in both the lower inclined portion and the upper inclined portion, or may fall in both of them.

(4) A program causing a computer to perform the filter control method of the present disclosure may be provided.

Likewise, a program causing a common computer or a signal processing processor to function as the filter element of the present disclosure may be provided. Any program can be written in a computer-readable recording medium and distributed, or can be distributed by download through electronic communication lines such as the Internet.

The program illustrated above can be provided in a form stored in a computer-readable recording medium and can be installed in a computer. The recording medium is, for example, a non-transitory recording medium, and an optical recording medium (optical disk) such as a CD-ROM is suitable; however, the recording medium may also include a recording medium in a known optional format such as a semiconductor recording medium and a magnetic recording medium. The non-transitory recording medium includes an optional recording medium except for a transitory, propagating signal, and does not exclude a volatile recording medium. Furthermore, for example, in a configuration in which a distribution device distributes the program through a communication network such as the Internet, a storage device storing the program in the distribution device corresponds to the above-described non-transitory recording medium.

Appendixes

A filter controlling method according to one example ("Aspect 1") of the present disclosure is a method implemented by a processor, the filter controlling method includes: receiving parameters that define a frequency response in a given frequency bandwidth, in which the given frequency bandwidth includes: a lower inclined portion in which a gain changes; an upper inclined portion in which the gain changes; and a center inclined portion in which the gain changes and that is present between the lower inclined portion and the upper inclined portion; generating, based on the parameters, a response curve representative of a frequency response of a filter; and generating, based on the response curve, a filter coefficient of the filter, in which the lower inclined portion corresponds to, within the given frequency bandwidth, a frequency bandwidth that is lower than a frequency bandwidth corresponding to the upper inclined portion.

In one example ("Aspect 2") according to Aspect 1, the parameters include a parameter that corresponds to a filter element of the filter.

In one example ("Aspect 3") according to Aspect 1 or 2, the frequency response in a frequency bandwidth outside of the given frequency bandwidth has a reference level, irrespective of values of the parameters.

In one example ("Aspect 4") according to any one of Aspects 1 to 3, a gradient of the center inclined portion and the gain in the center inclined portion are defined by the specific parameter.

In one example ("Aspect 5") according to Aspect 4, a position and a width of the center inclined portion, on the frequency axis, are further defined by the specific parameter.

In one example ("Aspect 6") according to any one of Aspects 1 to 5, the generating the response curve includes adjusting the response curve such that: the response curve is continuous at a boundary between the lower inclined portion and the center inclined portion, and the response curve is continuous at a boundary between the upper inclined portion and the center inclined portion.

A recording medium according to one example ("Aspect 7") of the present disclosure is a recording medium having recorded therein a program executed by a processor, the program causes the processor to: receive parameters that define a frequency response in a given frequency bandwidth, in which the given frequency bandwidth includes: a lower inclined portion in which a gain changes; an upper inclined portion in which the gain changes; and a center inclined portion in which the gain changes and that is present between the lower inclined portion and the upper inclined portion; generate, based on the parameters, a response curve representative of a frequency response of a filter; and generate, based on the response curve, a filter coefficient of the filter, in which the lower inclined portion corresponds to, within the given frequency bandwidth, a frequency bandwidth that is lower than a frequency bandwidth corresponding to the upper inclined portion.

A frequency characteristics controlling method according to an example ("Aspect 8") of the present disclosure is a controlling method implemented by a processor, the method includes providing a filter element that controls frequency characteristics of a sound signal in a specific frequency bandwidth, the controlling of the frequency characteristics includes: controlling, based on a first parameter and a second parameter, a position and a width of the specific frequency bandwidth on a frequency axis; and controlling, based on a third parameter and a fourth parameter, a gradient of a frequency response in the specific frequency bandwidth, and a gain of the frequency response in the specific frequency bandwidth.

A system for implementing filter control of the present disclosure includes: an audio processing apparatus; an analog-to-digital converter; a digital-to-analog converter; a filter; and a processor, the processor being configured to: receive parameters that define a frequency response in a given frequency bandwidth, in which the given frequency bandwidth includes: a lower inclined portion in which a gain changes; an upper inclined portion in which the gain changes; and a center inclined portion in which the gain changes and that is present between the lower inclined portion and the upper inclined portion; generate, based on the parameters, a response curve representative of a frequency response of a filter; and generate, based on the response curve, a filter coefficient of the filter, in which the lower inclined portion corresponds to, within the given frequency bandwidth, a frequency bandwidth that is lower than a frequency bandwidth corresponding to the upper inclined portion.

DESCRIPTION OF REFERENCE SIGNS

1 Audio processing apparatus
10 Analog-to-digital converter
20 Filter
30 Digital-to-analog converter
40 Filter coefficient calculator
50 Setter
110 CPU
120 Nonvolatile memory
130 Volatile memory
140 User interface
150 External device interface
160 SPU
170 Bus

What is claimed is:
1. A system for implementing filter control comprising:
an audio processing apparatus;
an analog-to-digital converter;
a digital-to-analog converter;
a filter; and
a processor, the processor being configured to:
  receive parameters that define a frequency response in a given frequency bandwidth,
    wherein the given frequency bandwidth includes:
      a lower inclined portion in which a gain changes;
      an upper inclined portion in which the gain changes; and
      a center inclined portion in which the gain changes and that is present between the lower inclined portion and the upper inclined portion;
  generate, based on the parameters, a response curve representative of a frequency response of a filter; and
  generate, based on the response curve, a filter coefficient of the filter, wherein
  the lower inclined portion corresponds to, within the given frequency bandwidth, a frequency bandwidth that is lower than a frequency bandwidth corresponding to the upper inclined portion.

2. A filter controlling method implemented by a processor, the filter controlling method comprising:
receiving parameters that define a frequency response in a given frequency bandwidth,
  wherein the given frequency bandwidth includes:
    a lower inclined portion in which a gain changes;
    an upper inclined portion in which the gain changes; and
    a center inclined portion in which the gain changes and that is present between the lower inclined portion and the upper inclined portion;
generating, based on the parameters, a response curve representative of a frequency response of a filter; and generating, based on the response curve, a filter coefficient of the filter, wherein
the lower inclined portion corresponds to, within the given frequency bandwidth, a frequency bandwidth that is lower than a frequency bandwidth corresponding to the upper inclined portion.

3. The filter controlling method according to claim 2, wherein the parameters include a parameter that corresponds to a filter element of the filter.

4. The filter controlling method according to claim 2, wherein the frequency response in a frequency bandwidth outside of the given frequency bandwidth has a reference level, irrespective of values of the parameters.

5. The filter controlling method according to claim 2, wherein a gradient of the center inclined portion and the gain in the center inclined portion are defined by the specific parameter.

6. The filter controlling method according to claim 5, wherein a position and a width of the center inclined portion, on the frequency axis, are further defined by the specific parameter.

7. The filter controlling method according to claim 2, wherein the generating the response curve includes adjusting the response curve such that:

the response curve is continuous at a boundary between the lower inclined portion and the center inclined portion, and the response curve is continuous at a boundary between the upper inclined portion and the center inclined portion.

8. A frequency characteristics controlling method implemented by a processor, the method comprising providing a filter element that controls frequency characteristics of a sound signal in a specific frequency bandwidth, the controlling of the frequency characteristics includes:

controlling, based on a first parameter and a second parameter, a position and a width of the specific frequency bandwidth on a frequency axis; and controlling, based on a third parameter and a fourth parameter, a gradient of a frequency response in the specific frequency bandwidth, and a gain of the frequency response in the specific frequency bandwidth.

* * * * *